US012374766B2

(12) United States Patent
Chen et al.

(10) Patent No.: US 12,374,766 B2
(45) Date of Patent: Jul. 29, 2025

(54) ATTENUATION APPARATUS AND TEST SYSTEM (71) Applicant: CALTERAH SEMICONDUCTOR TECHNOLOGY (SHANGHAI) CO., LTD, Shanghai (CN)

(72) Inventors: Zhefan Chen, Shanghai (CN); Dian Wang, Shanghai (CN); Shan Li, Shanghai (CN); Kaijie Zhuang, Shanghai (CN); Xuejuan Huang, Shanghai (CN)

(73) Assignee: CALTERAH SEMICONDUCTOR TECHNOLOGY (SHANGHAI) CO., LTD, Shanghai (CN)

( * ) Notice: Subject to any disclaimer, the term of this patent is extended or adjusted under 35 U.S.C. 154(b) by 294 days.

(21) Appl. No.: 18/113,642

(22) Filed: Feb. 24, 2023

(65) Prior Publication Data

US 2023/0208000 A1 Jun. 29, 2023

Related U.S. Application Data (63) Continuation of application No. PCT/CN2022/114319, filed on Aug. 23, 2022.

(30) Foreign Application Priority Data

Sep. 16, 2021 (CN) .......................... 202111087359.3

(51) Int. Cl.
*H01P 1/22* (2006.01)
*G01R 31/28* (2006.01)
(52) U.S. Cl.
CPC .......... *H01P 1/222* (2013.01); *G01R 31/2851* (2013.01)

(58) Field of Classification Search
CPC ........ H01P 1/222; H01P 1/22; G01R 31/2851
(Continued)

(56) References Cited

U.S. PATENT DOCUMENTS

2020/0412407 A1 12/2020 Ioffe et al.
2021/0218146 A1 7/2021 Hashimoto

FOREIGN PATENT DOCUMENTS

CN 108011163 A 5/2018
CN 108520996 A 9/2018
(Continued)

OTHER PUBLICATIONS

CN_108011163_A_I_translated is an English translation of CN108011163 (Year: 2018).*
(Continued)

*Primary Examiner* — Andrea Lindgren Baltzell
*Assistant Examiner* — Abigail Amir Yaldo
(74) *Attorney, Agent, or Firm* — BROOKS KUSHMAN P.C.

(57) ABSTRACT

An attenuation apparatus and a test system. The attenuation apparatus includes a signal transmission channel and at least one radiation loss structure, wherein the signal transmission channel is configured to perform transmission attenuation on the energy of a transmitted signal; the radiation loss structure is arranged in the signal transmission channel; the radiation loss structure has a first operating state and a second operating state; when the radiation loss structure is in the first operating state, the radiation loss structure is configured to perform radiation attenuation on the energy of a signal transmitted by the signal transmission channel; and when the radiation loss structure is in the second operating state, the radiation loss structure is configured to perform transmission attenuation on the energy of the signal transmitted by the signal transmission channel.

18 Claims, 3 Drawing Sheets (58) Field of Classification Search
USPC .................................................. 333/81, 81 B
See application file for complete search history.

(56) References Cited

FOREIGN PATENT DOCUMENTS

| | | | |
|---|---|---|---|
| CN | 112688046 | A | 4/2021 |
| CN | 113937443 | A | 1/2022 |
| RU | 2022420 | C1 | 10/1994 |
| WO | 9320595 | A1 | 10/1993 |

OTHER PUBLICATIONS

WO1993020595A1_-_Adjustable attenuator_-_English_Translation is an English translation of WO1993020595 (Year: 1993).*
International Search Report for Application No. PCT/CN2022/114319, dated Oct. 27, 2022, 4 Pages (including English Translation).
First Office Action for Chinese Application No. 202111087359.3, dated Mar. 30, 2022, 19 Pages (including English Translation).
Second Office Action for Chinese Application No. 202111087359.3, dated Sep. 29, 2022, 12 Pages (including English Translation).
European Search Report for EP Application No. 22791165.8-1205/4170817 PCT/CN2022114319, dated Feb. 8, 2024, 10 pages.
CNIPA Decision of Rejection, CN Application No. 202111087359.3, dated Jan. 19, 2023 (15 pages, including English translation).

\* cited by examiner

ATTENUATION APPARATUS AND TEST SYSTEM

CROSS-REFERENCE TO RELATED APPLICATIONS

This application is a continuation of International Patent Application No. PCT/CN2022/114319 filed on Aug. 23, 2022, which claims priority to Chinese Application No. CN202111087359.3 filed on Sep. 16, 2021, which are hereby incorporated herein by reference in their entireties.

TECHNICAL FIELD

Embodiments of the present disclosure relate to, but are not limited to, the field of radio technology, in particular to an attenuation apparatus and a test system.

BACKGROUND

In a test system, in order to control the amount of signal energy, simulation of a signal in a specific application scenario may be implemented by adopting an electronic component with a signal attenuation function, this kind of electronic components are called attenuators. For an attenuator, it is needed that after an input signal is transmitted to a system, the input signal is converted into other energy in the system and lost. However, in a millimeter wave frequency band, it is impossible to obtain accurate attenuation values of components such as resistors.

In a current radio frequency test system, microstrip lines, waveguides, or substrate integrated waveguide transmission lines are generally used for designing passive attenuators with fixed insertion loss.

However, due to a deviation within a certain range of a material parameter used in processing and an influence of processing accuracy, a real attenuation value of an attenuator varies within a range, so it is difficult to control an attenuation value of a designed attenuator accurately.

SUMMARY

The following is a summary of subject matters described in detail herein. This summary is not intended to limit the protection scope of claims.

According to some embodiments, the present disclosure provides an attenuation apparatus including a signal transmission channel and at least one radiation loss structure; wherein the signal transmission channel is configured to perform transmission attenuation on energy of a transmitted signal. The radiation loss structure is disposed in the signal transmission channel, and the radiation loss structure has a first working state and a second working state. The radiation loss structure is configured as that: when in the first working state, the radiation loss structure is configured to perform radiation attenuation on energy of a signal transmitted by the signal transmission channel; when in the second working state, the radiation loss structure is configured to perform transmission attenuation on energy of a signal transmitted by the signal transmission channel.

In the attenuation apparatus provided by the above embodiment, the radiation loss structure has the first working state and the second working state. By making the radiation loss structure work in the first working state or the second working state, an energy attenuation mode of the radiation loss structure is switched, and then different energy attenuation values are generated, so that after processing, an attenuation value generated by the attenuation apparatus may be effectively changed through a state of the radiation loss structure, which is simple in use and low in cost, and can bring more design space for a link loss of a test system.

In an implementation mode, the radiation loss structure includes a radiation loss unit and a physical switch; wherein when the physical switch is in an opened state, a radiation transmission path of a corresponding radiation loss unit is unblocked, and the radiation loss unit is configured to perform radiation attenuation on the energy of the signal transmitted by the signal transmission channel; when the physical switch is in a closed state, a radiation transmission path of a corresponding radiation loss unit is blocked, and the radiation loss unit is configured to perform transmission attenuation on the energy of the signal transmitted by the signal transmission channel.

In the attenuation apparatus provided in the above embodiment, a working state of the radiation loss structure is switched by opening and closing the physical switch, and an operation is relatively simple.

In an embodiment, the radiation loss unit includes a slot radiation unit.

When a radiation loss unit includes a slot radiation unit, a radiation attenuation value may be changed by changing parameters such as a size and a shape of a slot, so as to control the change of the attenuation value of a whole attenuation apparatus more finely and improve the quantity of application scenarios of the attenuation apparatus.

In an embodiment, the signal transmission channel includes a substrate integrated waveguide structure.

In an embodiment, the substrate integrated waveguide structure includes a first metal layer, a second metal layer, and a dielectric layer located between the first metal layer and the second metal layer; multiple metallized through holes are disposed in the dielectric layer, and the multiple metallized through holes are used for connecting the first metal layer and the second metal layer to form a waveguide path; the slot radiation unit is disposed on the first metal layer or the second metal layer.

In an embodiment, the first metal layer may be a first metal substrate and the second metal layer may be a second metal substrate.

In an embodiment, center points of orthographic projections of the multiple metallized through holes on an upper surface of the first metal layer form at least two parallel straight lines; an orthographic projection of the slot radiation unit on the upper surface of the first metal layer is located between two adjacent parallel straight lines.

In an embodiment, the physical switch includes a metal patch; when the physical switch is in the closed state, the metal patch completely covers the slot radiation unit and blocks a radiation transmission path of a corresponding radiation loss unit, so as to perform transmission attenuation on the energy of the signal transmitted by the signal transmission channel.

In an embodiment, multiple metallized through holes on each straight line are arranged at equal intervals; a width between at least two parallel straight lines is obtained based on a following formula:

$$W = \frac{c}{2f_c\sqrt{\varepsilon_r}} + \frac{R^2}{0.95S}$$

W is a width between two parallel straight lines; c is a speed of light; $f_c$ is a cut-off frequency required for the attenuation apparatus; $\varepsilon_r$ is a dielectric constant of the dielectric layer; R is a diameter of a metallized through hole; S is an interval between centers of two adjacent metallized through holes.

In an embodiment, the substrate integrated waveguide structure includes a first metal layer, a second metal layer, and a dielectric layer located between the first metal layer and the second metal layer. Multiple metallized through holes are disposed in the dielectric layer, center points of orthographic projections of the multiple metallized through holes on an upper surface of the first metal layer form at least two groups of curves, a bend-shaped signal transmission channel is formed between the two groups of curves, and the multiple metallized through holes are used for connecting the first metal layer and the second metal layer to form a waveguide path. The slot radiation unit is disposed on the first metal layer or the second metal layer, and an orthographic projection on the upper surface of the first metal layer is located on a signal transmission channel between two adjacent curves.

In an embodiment, the dielectric layer is further provided with multiple reflection suppression vias located at corners of the signal transmission channel.

According to some embodiments, the present disclosure also provides a test system including a wave source generation apparatus, a device under test, and the attenuation apparatus as described in any of the above embodiments. Wherein a first end of the attenuation apparatus is connected with an output end of the wave source generation apparatus, a second end of the attenuation apparatus is connected with the device under test, and the attenuation apparatus is configured to attenuate energy of a source signal emitted by the wave source generation apparatus, generate a target test signal with preset energy, and provide the target test signal with preset energy to the device under test, so as to test the device under test.

In the test system provided by the above embodiment, the attenuation means provided in some of the aforementioned embodiments is included, and a radiation loss structure in the attenuation apparatus has a first working state and a second working state. By making the radiation loss structure work in the first working state or the second working state, an energy attenuation mode of the radiation loss structure is switched, and then different amounts of energy attenuation are generated, so that after processing, an attenuation value generated by the attenuation apparatus may be effectively changed through a state of the radiation loss structure, so as to meet requirements on energy of a transmitted signal under different pieces to be tested or different test requirements, which is simple in use and low in cost, and brings more design space for a link loss of the test system.

In an embodiment, the wave source generation apparatus is a first chip tested to meet requirements, and is configured to test signal receiving performance of a second chip as a device under test; wherein the first chip and the second chip are chips with a same style.

In the test system provided by the above embodiment, the wave source generation apparatus and the device under test are all chips applied in a radio device, a first chip which has been tested to meet requirements is used as the wave source generation apparatus, so that the attenuation apparatus can perform attenuation based on a signal with a specific amplitude, signal receiving performance of a second chip used as the device under test is tested, thus the test for the device under test is more accurate and the wave source generation apparatus does not need to be designed additionally, which is beneficial to reducing a test cost in large-scale production.

In an embodiment, an emitting signal channel of the first chip is connected with a receiving signal channel of the second chip through the attenuation apparatus.

Other aspects will become apparent after reading and understanding the drawings and detailed description.

BRIEF DESCRIPTION OF DRAWINGS

To more clearly explain embodiments of the present disclosure or technical solutions in conventional technologies, drawings that need to be used in the description of the embodiments or conventional technologies will be briefly introduced in the following. It will be apparent that the drawings in the following description are only some embodiments of the present disclosure. For those of ordinary skill in the art, other drawings may be obtained according to those drawings without paying any creative effort.

DETAILED DESCRIPTION

For ease of understanding, embodiments of the present disclosure will be described more completely below with reference to related drawings. The embodiments of the present disclosure are given in the drawings. However, the embodiments of the present disclosure may be implemented in many different forms but are not limited to the embodiments described herein. On the contrary, those embodiments are provided for a purpose of making disclosed contents of the embodiments of the present disclosure more thorough and comprehensive.

Unless otherwise defined, all technical and scientific terms used herein have same meanings as those commonly understood by those skilled in the art of the present disclosure. Terms used in the specification of the present disclosure are for a purpose of describing the embodiments only but are not intended to limit the present disclosure.

It may be understood that terms "first", "second", and the like used in the embodiments of the present disclosure may be used herein for describing various elements, but such elements are not limited by those terms. Those terms are only used for distinguishing a first element from another element. For example, without departing from the scope of the embodiments of the present disclosure, a first metal layer may be referred to as a second metal layer and similarly the second metal layer may be referred to as the first metal layer. Both the first metal layer and the second metal layer are metal layers, but they are not a same metal layer.

It may be understood that a "connection" in the following embodiments should be understood as an "electrical connection", a "communication connection", and the like if electrical signals or data are transmitted between connected circuits, modules, units, etc. each other.

As used herein, singular forms of "a", "an", and "said/the" may also include plural forms, unless the context clearly indicates otherwise. It should also be understood that a term "including/containing", or "having", or the like designates presence of a stated feature, whole, component, part, or combination thereof, but does not exclude possibility of presence or addition of one or more other features, whole, component, part, or combination thereof. In addition, a term "and/or" as used in this specification includes any and all combinations of related listed items.

Usually, in a process of testing the performance of receiving and/or transmitting of a radio device, in order to simulate a signal in a real specific scenario, energy of a test signal in a propagation process needs to be controlled, thus a corresponding attenuator is needed to simulate a path loss in the signal propagation process. In a current radio frequency test system, microstrip lines, waveguides, or substrate integrated waveguide transmission lines are generally used for designing attenuators with fixed insertion losses. However, considering a deviation within a certain range of a material parameter used in processing, a circuit processing error in a millimeter wave band, matching of test links or consistency of dielectric loss, a signal attenuation value of an attenuator varies within a range, which has a certain deviation from an expected attenuation value obtained by theoretical simulation. That is to say, before a processing test, it is difficult to predict the signal attenuation value of the attenuator accurately, thereby the signal attenuation value of the attenuator cannot be controlled accurately. Moreover, once a needed attenuation value changes, a new attenuator must be designed, which is complicated and wasteful.

Figure 1:
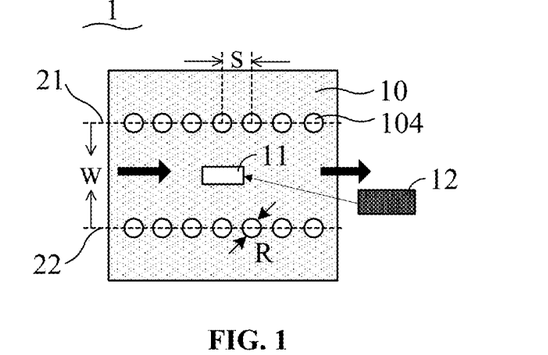
FIG. 1 is a schematic diagram of a top view structure of an attenuation apparatus provided in an embodiment of the present disclosure.

Based on this, the present disclosure provides an attenuation apparatus according to some embodiments. FIG. 1 is a schematic diagram of a top view structure of an attenuation apparatus in an embodiment. As shown in FIG. 1, an attenuation apparatus 1 may include a signal transmission channel and at least one radiation loss structure.

The signal transmission channel may be configured to perform transmission attenuation on energy of a transmitted signal; and the radiation loss structure is disposed in the signal transmission channel and has a first working state and a second working state.

When in the first working state, the radiation loss structure may be configured to perform radiation attenuation on energy of a signal transmitted by the signal transmission channel; when in the second working state, the radiation loss structure may be configured to perform transmission attenuation on energy of a signal transmitted by the signal transmission channel.

In the attenuation apparatus 1 provided in the above embodiment, each radiation loss structure has a first working state and a second working state. By making a radiation loss structure work in a first working state or a second working state, a mode of performing energy attenuation by the radiation loss structure is switched, and then different amounts of energy attenuation are generated by means of changing the radiation loss structure, so that after processing, an attenuation value generated by the attenuation apparatus 1 may be effectively changed through the radiation loss structure, which is simple in use and low in cost, and can bring more design space to a test system.

In the attenuation apparatus in an embodiment of the present disclosure, by arranging a radiation loss structure in a signal transmission channel, since the radiation loss structure produces different attenuation values for energy of a transmitted signal in different working states, thereby an attenuation value of energy of a signal may be controlled and changed by the attenuation apparatus. Compared with a traditional attenuator with a fixed attenuation value, the attenuation apparatus in the embodiments of the present disclosure may be applied to scenarios with different attenuation requirements. For example, for an application scenario with different attenuation values needed, only one design is needed, and a new attenuator does not need to be designed once again like a traditional way.

In addition, in preparation processes of various radio devices, there will be deviations within a certain range in manufacturing process and material parameters, etc., especially for some high-frequency devices, such as an attenuation device of a millimeter wave or even terahertz frequency band, there will be a certain deviation between an actual attenuation value manufactured by processing and a theoretical attenuation value in design. Therefore, an attenuation value of a manufactured attenuator may be adjusted by using a radiation loss structure disposed in a signal transmission channel, so that a final attenuation value approximates or even equals to the theoretical attenuation value, and an influence of manufacturing on the attenuation value of the attenuator may be effectively avoided.

In order to improve reliability of an attenuation apparatus, an attenuation value deviation range of the attenuation apparatus may be caused to be in an attenuation value variation range of the attenuation apparatus, that is, the attenuation value variation range [a, b], $a<c-\Delta d \leq c+\Delta d<b$, c is a theoretical value, $\Delta d$ is deviation, this deviation value may be set based on an actual scenario, for example, it is acquired through big data analysis based on historical data.

Furthermore, due to deviation generated during processing and manufacturing, a system using an attenuator may also produce a certain test error. An actual attenuation value of the attenuator is adjusted through a radiation loss structure disposed in a signal transmission channel, so that the attenuator is more compatible with the whole system. In addition, the attenuator with an adjustable loss value can also bring more design space to the system, thus effectively improving a success rate of system processing.

Transmission attenuation and radiation attenuation in the embodiments of the present disclosure refer to two different energy attenuation modes. In an embodiment, a signal transmission channel itself is capable of generating an initial attenuation value for energy of a transmitted signal by means of transmission attenuation. When a radiation loss structure is in a first working state, a radiation attenuation value is generated for energy of a signal transmitted by the signal transmission channel by means of radiation attenuation; or when the radiation loss structure is in a second working state, a transmission attenuation value is generated for the energy of the signal transmitted by the signal transmission channel by means of transmission attenuation. It may be understood that due to different energy attenuation modes, radiation attenuation values and transmission attenuation values are also different; and compared with transmission attenuation generated when a radiation loss structure does not exist, transmission attenuation generated when the radiation loss structure is in the second working state may be greater than, less than, or equal to, the transmission attenuation generated when a radiation loss structure does not exist. Therefore, different energy attenuation may be generated by changing a radiation loss structure, and an initial attenuation value may be adjusted, so that an attenuation value generated by the attenuation apparatus 1 is variable.

Optionally, the number of radiation loss structures may be multiple. After a processing test begins, by adjusting the number of radiation loss structures in a first working state and the number of radiation loss structures in a second working state, adjustment is perform based on an initial attenuation value, so that a signal attenuation value of the attenuation apparatus 1 gradually approximates and finally reaches an expected attenuation value acquired by theoretical simulation, so as to meet a high precision requirement on the signal attenuation value on a test path, and further improve a success rate of processing of an attenuation apparatus in a test system.

For example, in a possible embodiment, an initial attenuation value that can be generated by a signal transmission channel of the attenuation apparatus 1 is M dB. When a radiation loss structure is in a first working state, a radiation attenuation value of X dB is generated for energy of a signal transmitted by the signal transmission channel by means of radiation attenuation; when the radiation loss structure is in a second working state, a transmission attenuation value of Y dB is generated for energy of a signal transmitted by the signal transmission channel by means of transmission attenuation. If the attenuation apparatus 1 has 10 radiation loss structures, 5 radiation loss structures may be placed in the first working state and the remaining 5 radiation loss structures may be placed in the second working state before starting a processing test. At this time, a theoretical attenuation value of the attenuation apparatus 1 should be (M+5X+5Y) dB. After starting the processing test, the number of radiation loss structures in the first working state and the number of radiation loss structures in the second working state may be adjusted to approximate an expected attenuation value.

Continuing to refer to FIG. 1, in an embodiment, a radiation loss structure may include a radiation loss unit 11 and a physical switch 12.

When the physical switch 12 is in an opened state, a radiation transmission path of the corresponding radiation loss unit 11 is unblocked, at this time the radiation loss unit 11 is configured to perform radiation attenuation on energy of a signal transmitted by a signal transmission channel. When the physical switch 12 is in a closed state, the radiation transmission path of the corresponding radiation loss unit 11 is blocked, and at this time the radiation loss unit 11 is configured to perform transmission attenuation on the energy of the signal transmitted by the signal transmission channel.

The attenuation apparatus 1 provided in the above embodiment switches a working state of a radiation loss structure by opening and closing the physical switch 12, and an operation is relatively simple.

In an embodiment of the present disclosure, when the physical switch 12 is closed to enable the radiation loss unit 11 to perform transmission attenuation on the energy of the signal transmitted by the signal transmission channel, at this time a transmission attenuation value generated by the radiation loss unit 11 may be very small. In some possible embodiments, when the physical switch 12 is closed, it may be similar to the situation when the corresponding radiation loss unit 11 is absent.

Figure 2:
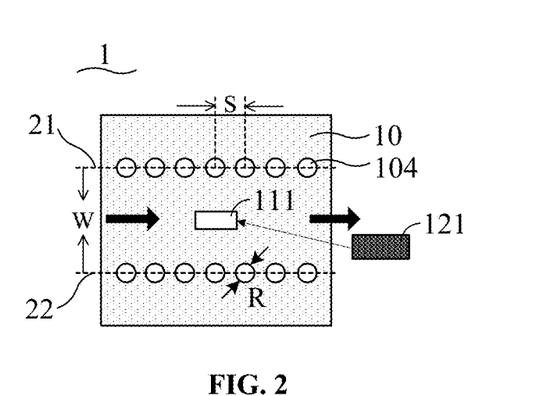
FIG. 2 is a schematic diagram of a top view structure of an attenuation apparatus provided in another embodiment of the present disclosure.

Referring to FIG. 2, in an embodiment, the radiation loss unit 11 may include a slot radiation unit 111.

In some possible embodiments, when the physical switch 12 is closed, it may be similar to the situation when the corresponding slot radiation unit 111 is absent, that is, similar to the situation when there is no slot at a position corresponding to the physical switch 12.

Optionally, the physical switch 12 involved in an embodiment of the present disclosure may include, but is not limited to, a metal patch 121, and a form of the physical switch 12 is not limited in an embodiment of the present disclosure.

In an embodiment, the physical switch 12 includes a metal patch 121; on a basis of the above embodiment, the physical switch 12 may be configured such that when the physical switch 12 is in a closed state, the metal patch 121 completely covers a slot radiation unit 111 and a radiation transmission path of the corresponding slot radiation unit 111 is blocked.

In the attenuation apparatus 1 provided in the above embodiment, a physical switch in a form of the metal patch 121 is used to control whether the slot radiation unit 111 radiates or not. When the metal patch 121 is pressed on the slot radiation unit 111, the slot radiation unit 111 is completely covered by the metal patch 121, and the slot radiation unit 111 is in a closed state, transmission attenuation is performed on energy of a signal transmitted by a signal transmission channel. When the slot radiation unit 111 is not completely covered by the metal patch 121, radiation attenuation is performed on the energy of the signal transmitted by the signal transmission channel. Therefore, by changing the number of slot radiation units 111 completely covered by the metal patch 121, the attenuation apparatus 1 is enabled to produce different signal attenuation after a processing test, an operation is simple, and a cost of the metal patch 121 is low.

It may be understood that a metal patch 121 may not completely cover a slot radiation unit 111, at this time, a radiation transmission path of the corresponding slot radiation unit 111 is not completely blocked, the slot radiation unit 111 performs radiation attenuation and transmission attenuation on energy of a signal transmitted by a signal transmission channel. It may be understood that an attenuation value, at this time, will be less than the amount of radiation attenuation generated when the slot radiation unit 111 is completely uncovered by the metal patch 121, but greater than the amount of transmission attenuation generated when the slot radiation unit 111 is completely covered. Therefore in some possible embodiments, the amount of radiation attenuation and/or transmission attenuation performed by the slot radiation unit 111 may be controlled by adjusting a size of an area of the slot radiation unit 111 covered by the metal patch 121, so that the attenuation apparatus 1 can generate more attenuation values, achieving a high precision requirement on a signal attenuation value on a test path, and bringing more design space to a test system.

Optionally, an action of picking-up and/or putting-down for the metal patch 121 may be achieved through, but not limited to, a manual manner, a robotic arm, or other manners, and a manner through which the action of picking-up and/or putting-down for the metal patch 121 is achieved is not limited in the embodiments of the present disclosure.

In an example, for convenience of movement, the action of picking-up and/or putting-down for the metal patch 121 may be achieved by using a mechanism or a manual physical manner.

Figure 3:
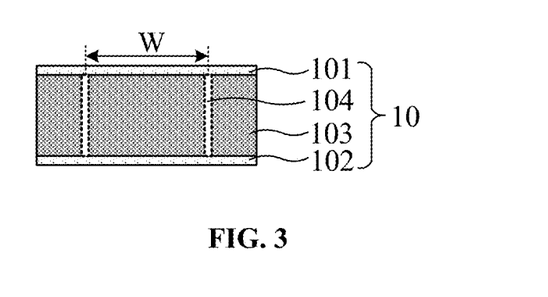
FIG. 3 is a schematic diagram of a side structure of an attenuation apparatus provided in an embodiment of the present disclosure.

Referring to FIG. 3, in an embodiment, a signal transmission channel includes a substrate integrated waveguide structure 10.

As shown in FIG. 3, in an embodiment, the substrate integrated waveguide structure 10 may include a first metal layer 101, a second metal layer 102, and a dielectric layer 103 located between the first metal layer 101 and the second metal layer 102.

In an example, multiple metallized through holes 104 may be provided in the dielectric layer 103 and the metallized through holes link the first metal layer 101 and the second metal layer 102; center points of orthographic projections of the multiple metallized through holes 104 on an upper surface of the first metal layer 101 form at least two parallel straight lines 21 and 22 (as shown in FIG. 1 or FIG. 2), and a waveguide path is formed between the straight line 21 and the straight line 22. In this example, the waveguide path is the aforementioned signal transmission channel, and two black arrows in FIG. 1 and FIG. 2 mark an entrance direction and an exit direction of the waveguide path respectively.

In an example, an arrangement manner of multiple metallized through holes 104 may include, but is not limited to, being arranged at equal intervals, and the arrangement manner of multiple metallized through holes 104 is not limited in the embodiments of the present disclosure. In the above example, multiple metallized through holes 104 are arranged at equal intervals.

Optionally, in an example, a width between at least two parallel straight lines 21 and 22 formed by the multiple metallized through holes 104 on the first metal layer 101 may be acquired based on a following formula.

$$W = \frac{c}{2f_c\sqrt{\varepsilon_r}} + \frac{R^2}{0.95S}$$

Continuing to refer to FIG. 1, in the above formula, W is the width between the two parallel straight lines 21 and 22; c is a speed of light; $f_c$ is a cut-off frequency of the attenuation apparatus 1; $\varepsilon_r$ is a dielectric constant of the dielectric layer 103; R is a diameter of a metallized through hole 104; S is an interval between centers of two adjacent metallized through holes 104.

It may be understood that in practical application, a parameter with a cut-off frequency being lower than an applicable frequency may be selected for design.

In an example, as shown in FIG. 2, a slot radiation unit 111 is disposed on a first metal layer 101 or a second metal layer 102, and an orthographic projection on an upper surface of the first metal layer 101 is located between two adjacent parallel straight lines 21 and 22.

Figure 4:
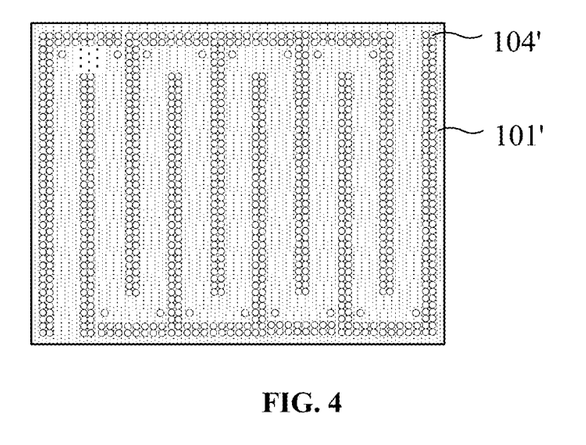
FIG. 4 is a schematic diagram of a top view structure of an attenuation apparatus.

An exemplary attenuation apparatus is shown in FIG. 4, in order to achieve a greater signal attenuation value in an attenuation apparatus with a relatively small area, a substrate integrated waveguide structure 10 in the attenuation apparatus may be arranged in a shape shown in FIG. 4, center points of orthographic projections of multiple metallized through holes 104' on an upper surface of a first metal layer 101' form a polyline (as shown in FIG. 4) to form a bend-shaped signal transmission channel, thereby lengthening a length of a signal transmission channel in the relatively small area and achieving greater signal attenuation. However, once the attenuation apparatus shown in FIG. 4 is processed, its signal attenuation value is a fixed value. Once a needed attenuation value changes, a new attenuation apparatus must be designed, which is complicated and wasteful.

Figure 5:
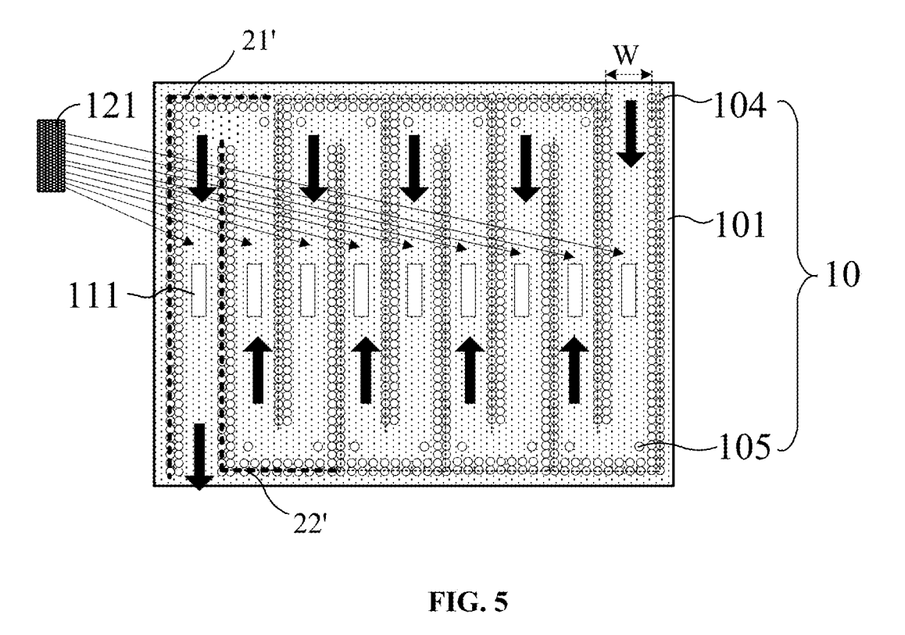
FIG. 5 is a schematic diagram of a top view structure of an attenuation apparatus provided in yet another embodiment of the present disclosure.
Figure 6:
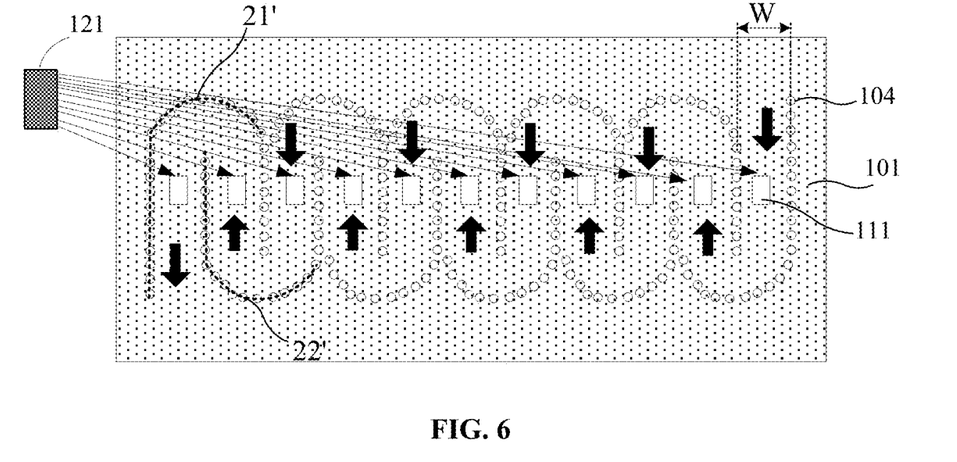
FIG. 6 is a schematic diagram of a top view structure of an attenuation apparatus provided in still another embodiment of the present disclosure.

Based on this, the present disclosure also provides another embodiment, as shown in FIGS. 5 and 6, which are schematic diagrams of two top view structures of the attenuation apparatus 1 in this embodiment. In the above embodiment, a substrate integrated waveguide structure 10 may include a first metal layer 101, a second metal layer 102, and a dielectric layer 103 located between the first metal layer 101 and the second metal layer 102.

In an example, the dielectric layer 103 may be provided with multiple metallized through holes 104 used for connecting the first metal layer 101 and the second metal layer 102 to constitute a waveguide path. Center points of orthographic projections of the multiple metallized through holes 104 on an upper surface of the first metal layer 101 form at least two groups of curves, and a bend-shaped signal transmission channel (a waveguide path) is formed between the two groups of curves. Multiple black arrows in FIG. 5 and FIG. 6 mark signal transmission directions of the bend-shaped waveguide path.

In an example, as shown in FIGS. 5 and 6, structures of the two groups of curves are symmetrical and are oppositely disposed in a second direction (exemplarily, the second direction may be a vertical direction in FIGS. 5 and 6).

In an example, as shown in FIGS. 5 and 6, each group of curves includes N curves, a first curve to an (N−1)th curve in each group of curves (such as curves 21' and 22' in FIGS. 5 and 6) are all L-shaped, an Nth curve in each group of curves is in a shape of "1", the first curve to the Nth curve in each group of curves are connected in turn, to form one or more U-shaped shapes connected side by side, and side edges of adjacent U-shaped shapes of multiple U-shaped shapes overlap, and two groups of curves are staggered in a first direction (exemplarily, the first direction may be a horizontal direction in FIGS. 5 and 6) by a distance of W, and W is a width of half of a U-shape in the first direction, wherein N is a natural number greater than 1.

In an example, as shown in FIGS. 5 and 6, a shape of a bend-shaped signal transmission channel is a multi-loop serpentine structure.

In an example, as shown in FIGS. 5 and 6, at least one loop of the bend-shaped signal transmission channel is provided with a slot radiation unit 111. Exemplarily, each loop of the bend-shaped signal transmission channel is provided with a slot radiation unit 111.

In an example, as shown in FIGS. 5 and 6, multiple metallized through holes 104 are distributed on both sides of a waveguide path, metallized through holes 104 on each side of the waveguide path may include two columns respectively. At this time, each two metallized through holes 104 arranged side by side may be regarded as a group. By providing two columns of metallized through holes 104 on each side of the waveguide path respectively, stability of signal transmission may be improved without increasing too much process difficulty.

In other examples, metallized through holes 104 on both sides of a waveguide path may also include only one column (as shown in FIGS. 1 and 2), or may also include two or more columns.

In some examples, as shown in FIG. 5, at least two groups of curves formed by center points of orthographic projections of multiple metallized through holes 104 on an upper surface of a first metal layer 101 may be at least two groups of polylines.

In an embodiment of the present disclosure, a polyline refers to a graph formed by connecting several points which are not on a straight line in turn by using line segments. A curve refers to a line formed by a moving point moving with continuously changing directions, and the curve includes a straight line, a polyline, a line segment, an arc and so on. As shown in FIG. 5, multiple curves (including curves 21' and 22') in FIG. 5 are all in a shape of a polyline. In other examples, as shown in FIG. 6, shapes of multiple curves (including curves 21' and 22' may be set as smooth curves.

In an example, a slot radiation unit 111 is disposed on a first metal layer 101 or a second metal layer 102, and an orthographic projection on an upper surface of the first metal layer 101 is located on a bend-shaped signal transmission channel between two groups of curves.

Continuing to refer to FIG. 5, in an embodiment, the dielectric layer 103 may also be provided with multiple reflection suppression vias 105 located at corners of a signal transmission channel. The attenuation apparatus 1 provided in the above embodiment can reduce signal reflection at a corner of a signal transmission channel by providing multiple reflection suppression vias 105 at corners of the signal transmission channel.

Optionally, both the first metal layer 101 and the second metal layer 102 involved in the embodiments of the present disclosure may include, but are not limited to, copper sheets, and materials of the first metal layer 101 and the second metal layer 102 are not limited in the embodiments of the present disclosure. A material of the metal patch 121 involved in the embodiments of the present disclosure may include, but is not limited to, copper, and the material of the metal patch 121 is not limited in the embodiments of the present disclosure.

In an embodiment, a material of a metal patch 121 may be the same as that of a first metal layer 101 and a second metal layer 102. At this time, when the metal patch 121 is pressed on a slot radiation unit 111, and when the slot radiation unit 111 is completely covered by the metal patch 121, the slot radiation unit 111 is in a closed state, and transmission attenuation is performed on energy of a signal transmitted by a signal transmission channel and an effect may be similar to that of the case that there is no slot radiation unit 111.

Taking the attenuation apparatus 1 provided in an embodiment shown in FIG. 5 as an example, a case in which the attenuation apparatus 1 is enabled to generate different signal attenuation values after a processing test by adjusting the number of slot radiation units 111 completely covered by the metal patch 121 is described.

For example, in a possible embodiment, a signal transmission channel of the attenuation apparatus 1 can generate an initial attenuation value of M dB. When a slot radiation unit 111 is not covered by the metal patch 121, the slot radiation unit 111 generates a radiation attenuation value of X dB for energy of the signal transmitted through the signal transmission channel by means of radiation attenuation. When a slot radiation unit 111 is completely covered by the metal patch 121, a transmission attenuation value of Y dB is generated for energy of a signal transmitted through the signal transmission channel by means of transmission attenuation. If there are P slot radiation units 111 not covered by the metal patch 121 and Q slot radiation units 111 completely covered by the metal patch 121, a signal attenuation value of the attenuation apparatus 1 is theoretically M+(X*P)+(Y*Q) dB. By adjusting different values of X and Y, the signal attenuation value M+(X*P)+(Y*Q) dB may be adjusted.

Optionally, in an embodiment, the metal patch 121 may be a metal with a certain thickness and a smooth flat surface; when the metal patch 121 in the above embodiment is pressed on a slot radiation unit 111, it can be fixed on the slot radiation unit 111 using its own gravity, thereby improving stability of blocking, by the metal patch 121, a radiation transmission path of the slot radiation unit 111.

In an embodiment, a shape of an orthographic projection of a slot radiation unit 111 on an upper surface of a first metal layer 101 may include, but is not limited to, at least one of a rectangle, a circle, an ellipse, a triangle, a crescent, and a polygon, and the shape of the slot radiation unit 111 is not limited in the embodiments of the present disclosure.

Optionally, in an embodiment, a shape of a physical switch 12 may be adjusted adaptively according to the shape of the orthographic projection of the slot radiation unit 111 on the upper surface of the first metal layer 101. For example, when the shape of the orthographic projection of the slot radiation unit 111 on the upper surface of the first metal layer 101 includes a circle, the shape of the physical switch 12 may also include a circle, and the shape of the physical switch 12 is not limited in the embodiments of the present disclosure.

Continuing to refer to FIG. 3 and FIG. 5, in an embodiment, the dielectric layer 103 may be a single-layer dielectric material layer, or may be a multi-layer dielectric material stacked layer, and a structure of the dielectric layer 103 is not limited in the embodiments of the present disclosure.

In an example, the dielectric layer 103 is a multi-layer dielectric material stacked layer. In the attenuation apparatus 1 provided by the above example, the dielectric layer 103 is arranged as a multi-layer dielectric material stacked layer, and the multi-layer dielectric material stacked layer is located between the first metal layer 101 and the second metal layer 102, so that when a greater attenuation loss is needed, an occupied area of the attenuation apparatus 1 is reduced and accuracy of the attenuation apparatus 1 is improved.

The attenuation apparatus in an embodiment of the present disclosure may be used in a signal transmitting link and/or a signal receiving link of a radio device, and may also be applied in a test system for a radio device. Application in a test system will be taken as an example to be described in detail below.

For example, performance of receiving and/or transmitting signals of a radio device is tested by using the attenuation apparatus 1. The radio device herein may include, but is not limited to, a chip structure having a function of receiving and/or transmitting signals.

Figure 7:
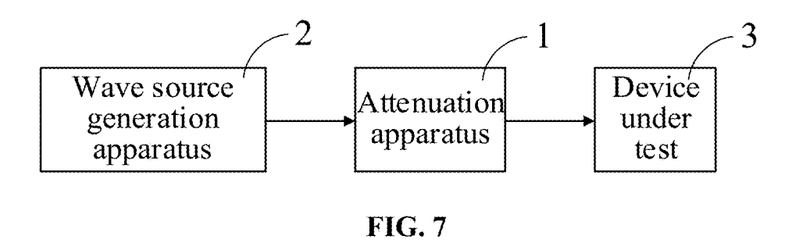
FIG. 7 is a schematic diagram of a structure of a test system provided in an embodiment of the present disclosure.

Referring to FIG. 7, the present disclosure also provides a test system according to some embodiments, and the test system may include a wave source generation apparatus 2, a device under test 3, and the attenuation apparatus 1 provided in any of the above embodiments.

A first end of the attenuation apparatus 1 is connected with an output end of the wave source generation apparatus 2, a second end of the attenuation apparatus 1 is connected with the device under test 3, that is, the attenuation apparatus 1 acts as a physical transmission channel to achieve a signal connection between the wave source generation apparatus 2 and the device under test 3. The attenuation apparatus 1 may be configured to perform variable attenuation on energy of a source signal emitted by the wave source generation apparatus 2, thus a target test signal can be supplied to the device under test 3 according to preset energy, so that the device under test 3 may be effectively tested in aspects such as signal receiving performance.

In the test system provided by the above embodiment, the attenuation apparatus 1 provided in some of the aforementioned embodiments is included, and a radiation loss structure in the attenuation apparatus 1 has a first working state and a second working state. By making the radiation loss structure work in the first working state or the second working state, a mode of performing energy attenuation by the radiation loss structure is switched, and then energy attenuations with different attenuation values are generated by means of changing the radiation loss structure, so that after processing, an attenuation value generated by the attenuation apparatus 1 may be effectively changed through the radiation loss structure, so as to achieve adjustment of signal attenuation on a signal transmission link, meet requirements on energy of a transmitted signal under different pieces to be tested 3 or different test requirements, which is simple in use, low in cost, and has more design space.

Optionally, a signal attenuation value of the attenuation apparatus 1 may gradually approximate and finally reach an expected attenuation value obtained by theoretical simulation by adjusting working states of several radiation loss structures after starting a processing test, so as to meet a high precision requirement on the signal attenuation value on a test path, and further improve a processing success rate of a test system.

Optionally, in the test system provided by an embodiment of the present disclosure, the number of attenuation apparatuses 1 may be one, two, or more, and the number of attenuation apparatuses 1 may be adaptively adjusted according to different pieces to be tested 3 or different test requirements, which is not limited in the embodiments of the present disclosure.

In an embodiment, both the wave source generation apparatus 2 and the device under test 3 may be a chip structure applied in a radio device.

Optionally, the wave source generation apparatus 2 may be a first chip tested to meet requirements, and configured to test signal receiving performance of a second chip used as the device under test 3.

Optionally, the first chip and the second chip may be chips with a same style or chips of a same production batch, so as to improve operability and convenience of testing, and be closer to practical application scenarios of chips such as sensors. Of course, according to different requirements, the wave source generation apparatus 2 and the device under test 3 may be chips with different styles or chips of different production batches, as long as a chip serving as the wave source generation apparatus 2 can meet test signal parameter requirements needed by the test.

In the test system provided by the above embodiment, the wave source generation apparatus 2 and the device under test 3 are all chips applied in a radio device, a first chip which has been tested to meet requirements is used as the wave source generation apparatus 2, so that the attenuation apparatus 1 can perform attenuation based on a signal with a specific amplitude, signal receiving performance of a second chip used as the device under test 3 is tested, thus the test for the device under test is more accurate and the wave source generation apparatus 2 does not need to be designed additionally, which is beneficial to reducing a test cost in large-scale production.

In an implementation mode, an emitting signal channel of the first chip used as the wave source generation apparatus 2 may be connected with a receiving signal channel of the second chip used as the device under test 3 through the attenuation apparatus 1.

Optionally, an emitting signal channel of the first chip may be physically connected with a receiving signal channel of the second chip through the attenuation apparatus 1 or connected by other forms of communication; and a connection mode between the emitting signal channel of the first chip and the receiving signal channel of the second chip is not limited in the embodiments of the present disclosure.

In an embodiment, the attenuation apparatus 1 and the device under test 3 may be connected by means of, but not limited to, at least one of a rectangular waveguide or a substrate dielectric integrated waveguide, and a connection mode between the attenuation apparatus 1 and the device under test 3 is not limited in the embodiments of the present disclosure.

In an embodiment, the first chip and/or the second chip in the embodiments of the present disclosure may be a chip of radio frequency transceiving, System on Chip (SoC), or AntonainPackage (AiP), and so on, such as various millimeter wave radar chips.

In the description of this specification, description referring to terms "an example", "an embodiment", "another embodiment", and the like means that features, structures, materials, or features described in combination with that embodiment or example are contained in at least one embodiment or example of the present disclosure. In this specification, illustrative description of the above terms does not necessarily refer to a same embodiment or example.

Various technical features in the above embodiments may be combined arbitrarily. For the sake of brevity of the description, not all possible combinations of various technical features in the above embodiments are described. However, as long as there is no conflict in the combinations of those technical features, they should be considered as falling within the scope specified in this specification.

The embodiments described above only provide several implementation modes of the present disclosure, and description thereof is relatively detailed, but is not to be interpreted as a limitation to the scope of the disclosure. It should be noted that for those of ordinary skill in the art, without departing from the concept of the present disclosure, several modifications and improvements may be made, all of which are within the protection scope of the present disclosure. Therefore, the patent protection scope of the present disclosure shall be subject to the appended claims.

What is claimed is:

1. An attenuation apparatus, comprising:
a signal transmission channel, configured to perform transmission attenuation on energy of a transmitted signal; and
at least one radiation loss structure, provided in the signal transmission channel;
wherein the radiation loss structure has a first working state and a second working state;
wherein when in the first working state, the radiation loss structure is configured to perform radiation attenuation on energy of a signal transmitted by the signal transmission channel;
when in the second working state, the radiation loss structure is configured to perform transmission attenuation on energy of a signal transmitted by the signal transmission channel,
wherein the radiation loss structure comprises a radiation loss unit and a physical switch;
wherein when the physical switch is in an opened state, a radiation transmission path of a corresponding radiation loss unit is unblocked, and the radiation loss unit is configured to perform radiation attenuation on the energy of the signal transmitted by the signal transmission channel;
when the physical switch is in a closed state, the radiation transmission path of the corresponding radiation loss unit is blocked, and the radiation loss unit is configured to perform transmission attenuation on the energy of the signal transmitted by the signal transmission channel, wherein the radiation loss unit comprises a slot radiation unit.

2. The attenuation apparatus according to claim 1, wherein the physical switch comprises a metal patch;
the physical switch is configured as that:
when the physical switch is in the closed state, the metal patch covers the slot radiation unit completely, and the radiation transmission path of the corresponding radiation loss unit is blocked, to perform transmission attenuation on the energy of the signal transmitted by the signal transmission channel.

3. A test system, comprising a wave source generation apparatus, a device under test, and the attenuation apparatus according to claim 1;
wherein a first end of the attenuation apparatus is connected with an output end of the wave source generation apparatus, a second end of the attenuation apparatus is connected with the device under test, and the attenuation apparatus is configured to attenuate energy of a source signal emitted by the wave source generation apparatus, generate a target test signal with preset energy, and provide the target test signal with preset energy to the device under test, to test the device under test.

4. The attenuation apparatus according to claim 1, wherein the signal transmission channel comprises a substrate integrated waveguide structure.

5. The attenuation apparatus according to claim 4, wherein the substrate integrated waveguide structure comprises a first metal layer, a second metal layer, and a dielectric layer located between the first metal layer and the second metal layer;
a plurality of metallized through holes are provided in the dielectric layer, and the plurality of metallized through holes are used for connecting the first metal layer and the second metal layer to form a waveguide path; the slot radiation unit is provided on the first metal layer or the second metal layer.

6. The attenuation apparatus according to claim 5, wherein the first metal layer is a first metal substrate and the second metal layer is a second metal substrate.

7. The attenuation apparatus according to claim 5, wherein center points of orthographic projections of the plurality of metallized through holes on an upper surface of the first metal layer form at least two parallel straight lines;
an orthographic projection of the slot radiation unit on the upper surface of the first metal layer is located between two adjacent parallel straight lines.

8. The attenuation apparatus according to claim 7, wherein a plurality of metallized through holes on each straight line of the at least two parallel straight lines are arranged at equal intervals;
a width between the two adjacent parallel straight lines is obtained based on a following formula:

$$W = \frac{c}{2f_c\sqrt{\varepsilon_r}} + \frac{R^2}{0.95S}$$

wherein W is the width between the two adjacent parallel straight lines; c is a speed of light; $f_c$ is a cut-off frequency of the attenuation apparatus; $\varepsilon_r$ is a dielectric constant of the dielectric layer; R is a diameter of a metallized through hole; S is an interval between centers of two adjacent metallized through holes.

9. The attenuation apparatus according to claim 5, wherein center points of orthographic projections of the plurality of metallized through holes on an upper surface of the first metal layer form at least two groups of curves, and a bend-shaped signal transmission channel is formed between the two groups of curves;
an orthographic projection of the slot radiation unit on the upper surface of the first metal layer is located on a signal transmission channel between the two groups of curves.

10. The attenuation apparatus according to claim 9, wherein the dielectric layer is further provided with a plurality of reflection suppression vias located at corners of the signal transmission channel.

11. The attenuation apparatus according to claim 9, wherein a shape of the signal transmission channel is a multi-loop serpentine structure and at least one loop of the signal transmission channel is provided with the slot radiation unit.

12. The attenuation apparatus according to claim 7, wherein the physical switch comprises a metal patch;
the physical switch is configured as that:
when the physical switch is in the closed state, the metal patch covers the slot radiation unit completely, and the radiation transmission path of the corresponding radiation loss unit is blocked, to perform transmission attenuation on the energy of the signal transmitted by the signal transmission channel.

13. The attenuation apparatus according to claim 8, wherein the physical switch comprises a metal patch;
the physical switch is configured as that:
when the physical switch is in the closed state, the metal patch covers the slot radiation unit completely, and the radiation transmission path of the corresponding radiation loss unit is blocked, to perform transmission attenuation on the energy of the signal transmitted by the signal transmission channel.

14. The test system according to claim 3, wherein the wave source generation apparatus is a first chip tested to meet test signal parameter requirements needed by a test, and is configured to test signal receiving performance of a second chip as the device under test; wherein the first chip and the second chip are millimeter wave radar chips.

15. The test system according to claim 14, wherein an emitting signal channel of the first chip is connected with a receiving signal channel of the second chip through the attenuation apparatus.

16. The attenuation apparatus according to claim 4, wherein the physical switch comprises a metal patch;
the physical switch is configured as that:
when the physical switch is in the closed state, the metal patch covers the slot radiation unit completely, and the radiation transmission path of the corresponding radiation loss unit is blocked, to perform transmission attenuation on the energy of the signal transmitted by the signal transmission channel.

17. The attenuation apparatus according to claim 5, wherein the physical switch comprises a metal patch;
the physical switch is configured as that:
when the physical switch is in the closed state, the metal patch covers the slot radiation unit completely, and the radiation transmission path of the corresponding radiation loss unit is blocked, to perform transmission attenuation on the energy of the signal transmitted by the signal transmission channel.

18. The attenuation apparatus according to claim 6, wherein the physical switch comprises a metal patch;

the physical switch is configured as that:

when the physical switch is in the closed state, the metal patch covers the slot radiation unit completely, and the radiation transmission path of the corresponding radiation loss unit is blocked, to perform transmission attenuation on the energy of the signal transmitted by the signal transmission channel.

* * * * *